(12) United States Patent
Shimane et al.

(10) Patent No.: US 8,153,033 B2
(45) Date of Patent: *Apr. 10, 2012

(54) AMORPHOUS TRANSPARENT CONDUCTIVE FILM, TARGET AND PRODUCTION METHOD FOR AMORPHOUS CONDUCTIVE FILM

(75) Inventors: Yukio Shimane, Sodegaura (JP); Kazuyoshi Inoue, Sodegaura (JP); Masato Matsubara, Sodegaura (JP); Nobuo Tanaka, Sodegaura (JP); Tokie Tanaka, legal representative, Sodegaura (JP); Shigekazu Tomai, Sodegaura (JP); Koki Yano, Sodegaura (JP); Shigeo Matsuzaki, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 381 days.

This patent is subject to a terminal disclaimer.

(21) Appl. No.: 11/908,037

(22) PCT Filed: Mar. 7, 2006

(86) PCT No.: PCT/JP2006/304373
§ 371 (c)(1),
(2), (4) Date: Jun. 14, 2009

(87) PCT Pub. No.: WO2006/095733
PCT Pub. Date: Sep. 14, 2006

(65) Prior Publication Data
US 2009/0250668 A1    Oct. 8, 2009

(30) Foreign Application Priority Data
Mar. 9, 2005 (JP) ................. 2005-064822

(51) Int. Cl.
*H01B 1/08* (2006.01)
*C09D 1/00* (2006.01)

(52) U.S. Cl. ........... 252/519.51; 252/518.1; 204/298.13; 204/192.12; 106/31.92; 106/286.1; 427/126.3

(58) Field of Classification Search ............. 252/519.51, 252/518.1; 204/298.13, 192.12; 106/31.92, 106/286.1; 427/126.3
See application file for complete search history.

(56) References Cited

U.S. PATENT DOCUMENTS

| 6,998,070 | B2 * | 2/2006 | Inoue et al. ............. 252/519.51 |
| 7,998,372 | B2 * | 8/2011 | Yano et al. .............. 252/519.51 |
| 2003/0037843 | A1 | 2/2003 | Hishida |
| 2004/0081836 | A1 * | 4/2004 | Inoue et al. .................. 428/469 |
| 2004/0251815 | A1 | 12/2004 | Tokailin et al. |
| 2007/0117237 | A1 * | 5/2007 | Inoue ............................. 438/30 |
| 2010/0108502 | A1 * | 5/2010 | Inoue et al. ............. 204/298.13 |
| 2010/0163860 | A1 * | 7/2010 | Yano et al. ...................... 257/43 |

FOREIGN PATENT DOCUMENTS

| JP | 06234565 | | 8/1994 |
| JP | 06330283 | A | 11/1994 |
| JP | 07235219 | | 9/1995 |
| JP | 09050712 | A | 2/1997 |
| JP | 2002129308 | A | 5/2002 |
| WO | WO 2004105054 | A1 * | 12/2004 |

* cited by examiner

*Primary Examiner* — Douglas Mc Ginty
(74) *Attorney, Agent, or Firm* — Millen, White, Zelano & Branigan, P.C.

(57) ABSTRACT

An amorphous transparent conductive film containing as a main component a six oxygen-coordinated metal oxide, and satisfying, in a radial distribution function (RDF) obtained by an X-ray scattering measurement, a relationship of A/B>1, providing that the maximum value of RDF at an interatomic distance of from 0.30 nm to 0.36 nm is A and the maximum value of RDF at an interatomic distance of from 0.36 nm to 0.42 nm is B.

10 Claims, 3 Drawing Sheets

AMORPHOUS TRANSPARENT CONDUCTIVE FILM, TARGET AND PRODUCTION METHOD FOR AMORPHOUS CONDUCTIVE FILM

TECHNICAL FIELD

The invention relates to an amorphous transparent conductive film, a target, and a method for producing an amorphous transparent conductive film.

BACKGROUND ART

In recent years, display devices have developed remarkably. Various display devices including LED display devices and EL display devices have been introduced into various OA apparatuses such as PCs and word processors. These display devices each have a structure in which a display element is interposed between transparent conductive films.

Currently, indium tin oxide (ITO) films constitute a mainstream of the conductive transparent film, since ITO films have excellent transparency, low resistance, good adhesion to a substrate, or the like. Generally, ITO films are prepared by the sputtering method.

ITO films have such a disadvantage that, since a strong acid is used for etching, other films or underlining structures, for example, a wire such as aluminum used in a gate line or a source/drain line in the case of a thin film transistor liquid crystal display device (TFT-LCD), may be damaged. On the other hand, attempts have been made to etch with a weak acid by forming an amorphous ITO film at low temperatures. However, ITO has an increased resistance in an amorphous state. In addition, controlling sputtering conditions for forming an amorphous ITO film is very difficult, and hence, has become a problem encountered during a production process.

To solve the above-mentioned problem, Patent Document 1 discloses a sputtering target formed of indium oxide and zinc oxide. Patent Document 2 discloses an amorphous transparent conductive film formed of indium oxide and zinc oxide.

The amorphous transparent conductive film is excellent in etching workability with a weak acid and exhibits excellent properties remaining no etching residues. However, it is known that, due to the amorphous nature, the surface of the conductive film becomes a thin film having a layer with a high resistance.

Due to the presence of the high-resistance layer on the surface, there is a possibility that a problem such as generation of a contact resistance between the transparent conductive film and an anisotropic conductive film (ACF) for connecting a TFT-LCD substrate and an external circuit or between the transparent conductive film and a probe for examination may occur.

Patent Document 1: JP-A-6-234565
Patent Document 2: JP-A-7-235219

The invention has been made in view of the above-mentioned problems. An object of the invention is to provide an amorphous transparent conductive film having a high degree of conductivity in which the resistance of a resistance layer on the surface of the conductive film is low, as well as to provide a method for producing the same.

SUMMARY OF THE INVENTION

The inventors have made extensive studies to solve the above-mentioned problems, and have found that, in an amorphous transparent conductive film having a metal oxide in which each metal atom is coordinated with six oxygen atoms, if a radial distribution function (RDF) satisfies a specific requirement, or peak components are not contained between a valence band peak derived from an oxygen 2p orbit and a peak derived from a conductive band electron (within a band gap) in an X-ray photoelectron spectroscopy (XPS), the resistance layer on the surface of an amorphous transparent conductive film has a decreased resistance value. The invention has been made based on this novel finding.

According to the invention, the following amorphous transparent conductive film and a method of producing the same can be provided.

1. An amorphous transparent conductive film containing as a main component a six oxygen-coordinated metal oxide, and satisfying, in a radial distribution function (RDF) obtained by an X-ray scattering measurement, a relationship of A/B>1, providing that the maximum value of RDF at an interatomic distance of from 0.30 nm to 0.36 nm is A and the maximum value of RDF at an interatomic distance of from 0.36 nm to 0.42 nm is B.
2. The amorphous transparent conductive film according to 1, which satisfies a relationship of A/C>2.8, providing that the maximum value of RDF at an interatomic distance of from 0.18 nm to 0.26 nm is C.
3. An amorphous transparent conductive film containing as a main component a six oxygen-coordinated metal oxide, which dose not contain a peak component between a valence band peak derived from an oxygen 2p orbit and a peak derived from a conductive band electron (within a band gap) of the amorphous transparent conductive film in an X-ray photoelectron spectroscopy (XPS).
4. The amorphous transparent conductive film according to any one of 1 to 3, wherein the six oxygen-coordinated metal oxide is indium oxide, and the amorphous transparent conductive film further contains zinc oxide.
5. The amorphous transparent conductive film according to 4, wherein the amount ratio of the indium oxide in the amorphous transparent conductive film is 70 to 95 mass %.
6. The amorphous transparent conductive film according to any one of 1 to 5, which further contains an oxide of a positive trivalent or higher metal.
7. A target containing as a main component a six oxygen-coordinated metal oxide in which the amount of oxygen is not more than a stoichiometric value of the metal oxide.
8. A method for producing the amorphous transparent conductive film according to any one of 1 to 6, comprising sputtering the target according to 7 at a partial pressure of water inside the sputtering system of $1\times10^{-4}$ Pa or less.
9. A method for producing the amorphous transparent conductive film according to one of 1 to 6, comprising forming an amorphous transparent conductive film by sputtering using a target which contains as a main component a six oxygen-coordinated metal oxide, and bringing the surface of the amorphous transparent conductive film into contact with hydrogen before bringing the amorphous transparent conductive film into contact with atmospheric air.

The invention provides an amorphous transparent conductive film which can exhibit improved conductivity due to a decreased resistance of a resistance layer on the surface of the conductive film and a method of producing the transparent conductive film.

BEST MODE FOR CARRYING OUT THE INVENTION

Figure 1:
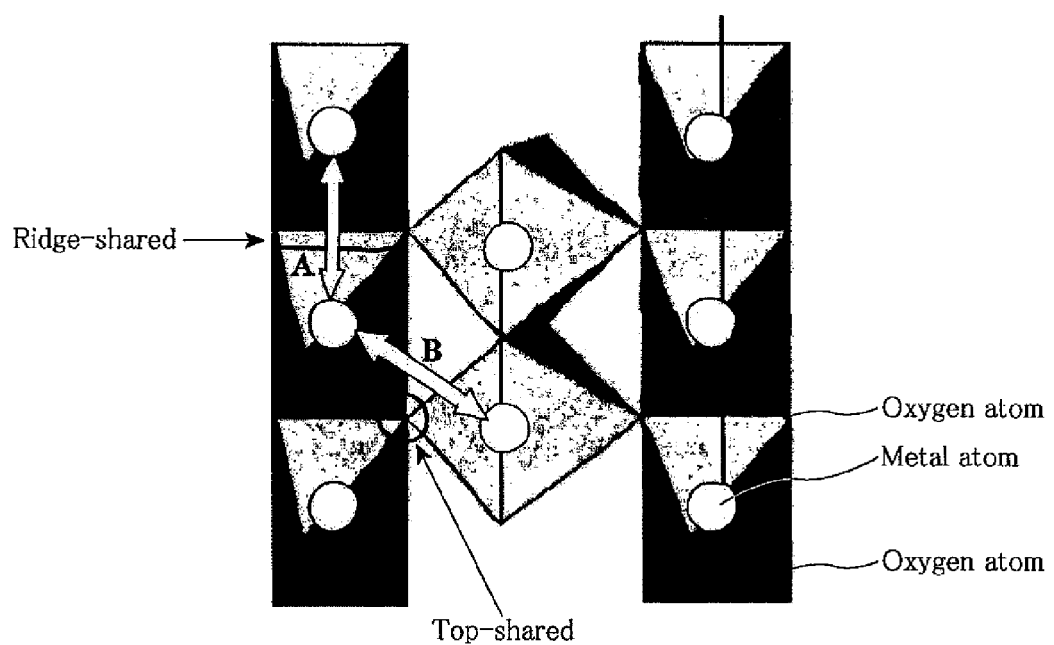
FIG. 1 is a conceptual view showing a structure of a six oxygen-coordinated metal oxide.

The amorphous transparent conductive film of the invention is described in detail below.

The amorphous transparent conductive film of the invention contains as a main component a six oxygen-coordinated metal oxide. Examples of a six oxygen-coordinated metal oxide include In, Sn, Ga, Ti, and V. These metals have a coordinate structure in which a metal atom is positioned at the center of an octahedron and oxygen atoms are positioned at the top of an octahedron. Preferred metal atoms include In and Sn.

The expression "containing as a main component a six oxygen-coordinated metal oxide" as referred to herein means that the content of the six oxygen-coordinated metal oxide in the amorphous transparent conductive film is 70 mass % or more.

The amorphous transparent conductive film may be formed of one, or two or more of the above-mentioned metal oxides. To improve amorphous stability of the amorphous transparent conductive film, it is preferred that the amorphous transparent conductive film contain indium oxide and zinc oxide.

It is preferred that the amount of indium oxide contained in the amorphous transparent conductive film be 70 to 95 mass %, more preferably 80 to 95 mass %. If the amount ratio of indium oxide is less than 70 mass %, the amorphous transparent conductive film may encounter such problems as an increased resistance value and deteriorated durability. An amount exceeding 95 mass % may result in formation of a crystalline film exhibiting significantly high resistance or having no durability.

The amorphous transparent conductive film of the invention may contain an oxide of a positive trivalent or higher metal. Containing such a metal oxide is preferable since deficiency due to substitution of a different element is formed, thereby contributing to generation of carrier electrons.

Examples of oxides of the positive trivalent or higher metal include oxides of Ga, Ge, and Sn.

As for the added amount of oxides of a positive trivalent or higher metal (hereinafter indicated as "M"), it is preferred that the mass ratio of M relative to the total amount of the metals contained in the amorphous transparent conductive film [M/(total amount of metal atoms+M)] be about 0.01 to 0.2, more preferably 0.1 to 0.15. If the mass ratio is less than 0.01, effects of addition may not be exhibited. A mass ratio exceeding 0.2 may result in an increased resistance of the conductive film.

Metal oxides other than those mentioned above may be added insofar as no adverse effect is exerted on the conductive film.

The amorphous transparent conductive film of the invention satisfies, in a radial distribution function (RDF) obtained by an X-ray scattering measurement, a relationship of A/B>1 providing that the maximum value of RDF at an interatomic distance from 0.18 nm to 0.26 nm is C, the maximum value at an interatomic distance of from 0.30 nm to 0.36 nm is A, and the maximum value of RDF at an interatomic distance of from 0.36 nm to 0.42 nm is B. It is also more preferred that the amorphous transparent conductive film satisfy a relationship of A/C>2.8.

FIG. 1 is a conceptual view showing a structure of a six oxygen-coordinated metal oxide.

In FIG. 1, a six oxygen-coordinated metal oxide is expressed as an octahedron. Two types of arrangement of adjacent metal atoms can be considered. One is an arrangement in which adjacent octahedrons share ridges (hereinafter referred to as "ridge-shared" and indicated as A in FIG. 1), and the other is an arrangement in which adjacent octahedrons share tops (hereinafter referred to as "top-shared", and indicated as B in FIG. 1). In these two sharing morphologies, ridge-shared metals have a smaller interatomic distance than top-shared metals. In ridge-shared metal atoms of which the interatomic distance is relatively small, a carrier electrons contributing to conductivity are easy to move due to a large degree of overlapping of the electron orbit.

Therefore, in an amorphous transparent conductive film, by increasing the ratio of chains of a metal atom octahedron to which six oxygen atoms are coordinated, which are connected by shared-ridges, the degree of carrier transfer can be increased, suppressing an increase in resistance of a resistance layer formed on the amorphous transparent conductive material.

The ratio of the ridge-shared metal atoms and the top-shared metal atoms can be obtained by a radial distribution function (RDF) obtained by an X-ray scattering measurement.

Figure 2:
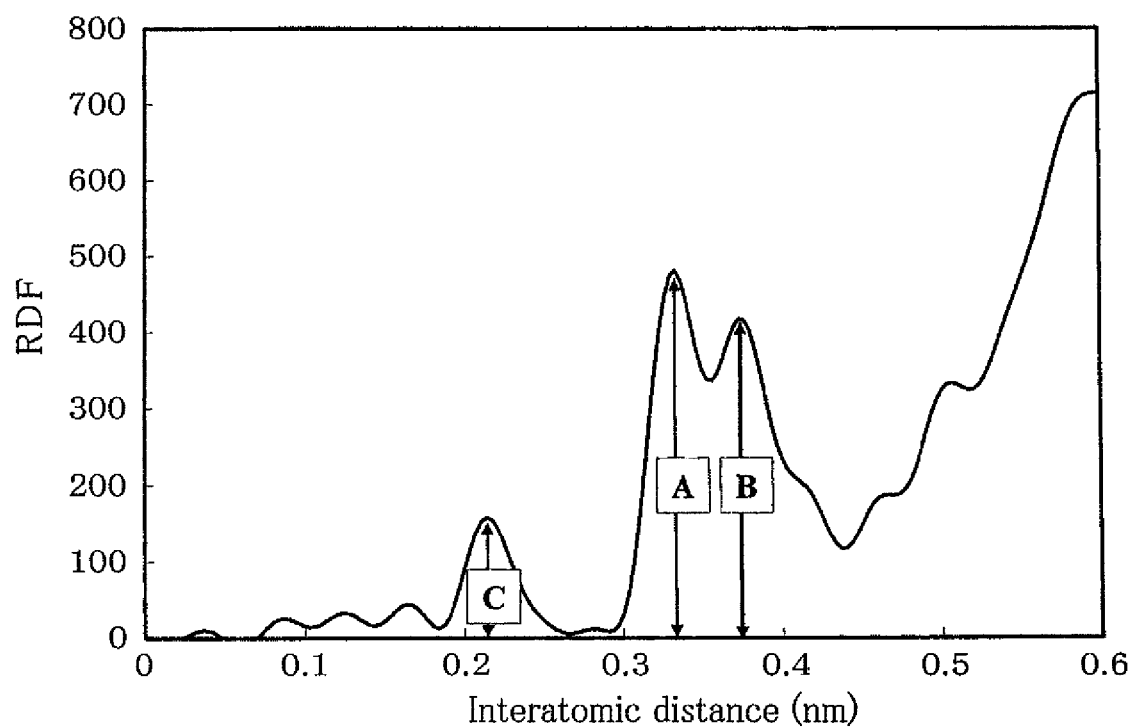
FIG. 2 is a view showing a radial distribution function (RDF) of the amorphous transparent conductive film prepared in Example 1.

FIG. 2 is a view showing a radial distribution function (RDF) of the amorphous transparent conductive film prepared in Example 1, given later.

A radial distribution function (RDF) can be obtained by analyzing an X-ray scattering curve. Specifically, a measurement is performed on an amorphous transparent conductive film formed on a substrate by grazing incident X-ray scattering method, thereby to measure scattering from the conductive material which does not contain scattering from the substrate. A radial distribution function (RDF) is obtained by subjecting the resultant scattering curve to a Fourier conversion.

In FIG. 2, peak (A) of an interatomic distance of from 0.30 nm and 0.36 nm indicates a relationship of ridge-shared two metal atoms, and peak (B) of an interatomic distance of from 0.36 nm to 0.42 nm indicates a relationship of two top-shared two metal atoms. Peak (C) of an interatomic distance of from 0.18 nm to 0.26 nm indicates a relationship between a metal atom and oxygen atoms coordinated thereto.

In a crystal state, the ratio of the ridge-shared metals and the top-shared metals is defined according to the crystal structure. An amorphous state is a disordered crystal state. The ratio of the ridge-shared metals and the top-shared metals is determined according to the manner of disorder.

In the invention, the ratio of the ridge-shared metals and the top-shared metals is defined to satisfy a relationship of A/B>1, preferably A/C>2.8. By satisfying such a relationship, a carrier electron contributing to conductivity can be moved readily, whereby a structure with a high degree of carrier transfer can be obtained. Therefore, although being amorphous, the film hardly becomes a thin film having a high resistance layer on the surface of a conductive film. As a result, the amorphous transparent conductive film of the invention has a lowered contact resistance with an ACF or a probe for examination.

The ratio of the ridge-shared metal atoms and the top-shared metal atoms (A/B) and the ratio of oxygen atoms coordinated thereto and the ridge-shared metal atoms (A/C)

can be controlled by adjusting the amount of oxygen in a target for sputtering or a composition of gas during sputtering, by subjecting a conductive film to a heat treatment in hydrogen gas, or the like.

The amorphous transparent conductive film of the invention does not contain peak components between a valence band peak derived from an oxygen 2p orbit and a peak derived from a conductive band electron (within a band gap) of the amorphous transparent conductive film in an X-ray photoelectron spectroscopy (XPS). The expression "does not contain peak components within the band gap" means that the intensity within the band gap is 1% or less of the maximum intensity of a valence band peak.

If a metal oxide is formed into an amorphous film, the resultant film tends to have a peak in a band gap. A peak in a band gap is caused by instable structural deficiency. When brought into contact with air in atmosphere, the film adsorbs oxygen or moisture, and hence, tends to form a high resistance layer on the surface of the conductive film.

The amorphous transparent conductive film of the invention contains no peak components within a band gap in an X-ray photoelectron spectroscopy (XPS), and hence, hardly becomes a thin film having a high resistance layer on the surface of the conductive layer in spite of its amorphous nature.

The amorphous transparent conductive film of the invention can be formed on a substrate by sputtering using a sputtering target formed of a sintered product containing the above-mentioned six oxygen-coordinated metal oxide.

Sputtering can be performed using a sputtering apparatus commonly used in the art.

In the method of the invention, as the sputtering target, the amount of oxygen in the target is not more than the stoichiometric value of a metal oxide. The term "the amount of oxygen" as referred to herein means a value obtained from an atomic ratio measured by an X-ray photoelectron spectroscopy. Difference between the amount of oxygen in the target and the stoichiometric value of a metal oxide is preferably 0.003 or more, more preferably 0.005 or more.

In the case of a sputtering target formed of indium oxide (89.3 mass %) and zinc oxide (10.7 mass %), the amount of oxygen is not more than the stoichiometric value if the atomic amount ratio [O/(In+Zn+O] is 0.586 or less.

By allowing the amount of oxygen in the target to be not more than the stoichiometric value of a metal oxide, oxygen deficiency is formed in the amorphous transparent conductive film, enabling the number of carrier electrons to be increased.

Such a sputtering target can be prepared by controlling the amount of oxygen during sintering. The amount of oxygen is controlled by, for example, performing sintering in an oxygen atmosphere during the initial stage of sintering, followed by stopping of oxygen supply in later sintering stages.

As an aid used in granulation of raw materials for forming a sputtering target, a polymer such as polyvinyl alcohol and polyacrylic acid, and a long-chain fatty acid such as stearic acid may be added. By adding such an aid, the raw materials can be processed readily during granulation and molding. Further, by mixing a carbon-containing additive, progress of oxidation during sintering can be suppressed. As a result, a target containing oxygen in an amount not more than the stoichiometric value can be readily obtained.

In the invention, to allow the amount of oxygen in the amorphous transparent conductive film to be not more than the stoichiometric value, the partial pressure of water in the system (chamber) during sputtering (during film forming) is adjusted to $1 \times 10^{-4}$ Pa or less. Since the partial pressure of water in the system (chamber) cannot be measured directly, the ultimate vacuum of the sputtering apparatus which contains water in the system (chamber), oxygen, nitrogen, or the like is used as an indication for the partial pressure of the water in the system (chamber). That is, if the ultimate vacuum is $1 \times 10^{-4}$ Pa or less, the partial pressure of water is also $1 \times 10^{-4}$ Pa or less.

In the case where an amorphous transparent conductive film is formed under conditions which do not satisfy the above-mentioned conditions regarding the stoichiometric value, the amorphous transparent conductive film of the invention can be obtained by, after forming an amorphous transparent conductive film, bringing the surface of the film into contact with hydrogen before bringing the film into contact with atmospheric air.

Specific examples of a method for bringing the surface of the film into contact with hydrogen include a method in which an amorphous transparent conductive film is formed on a substrate under vacuum in a sputtering chamber of a sputtering apparatus, and hydrogen is supplied to the sputtering chamber before exposing the substrate to atmosphere. At that time, hydrogen may be mixed with an inert gas (e.g. argon).

Although there are no particular restrictions on the processing conditions, the processing temperature may be around 150 to 300° C. and the processing time may be around 1 to 60 minutes.

EXAMPLES

The invention will be described in more detail according to Examples.

Example 1

(1) Preparation of Sputtering Target

As raw material powder, indium oxide powder and zinc oxide powder each having an average particle diameter of 1 μm or less were used. The predetermined amounts of the indium oxide powder and the zinc oxide powder were weighed such that the amount of indium oxide became 89.3 mass % and the amount of zinc oxide became 10.7 mass %. After mixing, the resultant mixture was placed in a resin-made pot. Using water as a medium, the mixture was subjected to wet ball mill blending.

As an aid for granulation, polyvinyl alcohol was added. Granulation was performed smoothly without causing problems when polyacrylic acid or stearic acid was used.

Pulverization and mixing were performed using a hard oxidized zirconium ball. Mixing was performed for 20 hours. Thereafter, slurry of the mixture was removed, and subjected to filtration, drying, and granulation. The resultant granulated product was put in a mold, and subjected to cold isostatic pressing by applying a pressure of 3 tons/cm$^2$ to be molded into a predetermined shape.

Subsequently, the resultant molded product was held at 1450° C. for 5 hours for sintering while supplying air to a sintering furnace at a rate of 5 l/min per 0.1 m$^3$ of the inner volume of the furnace. The temperature in the furnace was elevated at a rate of 1° C./min until the temperature reached 1000° C., and at a rate of 3° C./min while the temperature was between 1000 and 1470° C.

Thereafter, the supply of air was stopped. The furnace temperature was lowered at a rate of 10° C./min while the temperature was between 1450° C. and 1300° C. Then, argon was supplied at a rate of 10 l/min per 0.1 m$^3$ of the inner volume of the furnace. After holding at 1300° C. for 3 hours, the molded product was allowed to cool.

The density of the so-obtained sintered product was measured according to the Archimedes' method using water. The relative density was calculated from the theoretical density. The theoretical density was calculated from the weight ratio of an indium oxide crystal (bixbyite structure) and zinc oxide having no oxygen deficiency.

The content of zinc in the sintered product was quantitatively analyzed using the ICP emission spectroscopy method. It was confirmed that the composition at the time of mixing raw materials was maintained.

Subsequently, the portion of the sintered product to be sputtered was polished using a cup grinder to have a size of 152 mm in diameter and 5 mm in thickness, whereby a sintered target for a transparent conductive thin film was obtained.

The target was attached to a backing plate using an indium-based alloy to obtain a sputtering target.

The density of the resultant sputtering target was 6.84 g/cc and the amount of oxygen (atomic amount ratio, the same can be applied to the following) was 0.578.

(2) Formation of Transparent Conductive Film

The sputtering target prepared in (1) above was placed in a sputtering apparatus. A transparent conductive film was formed on a silicon substrate. As the film forming conditions, the ultimate vacuum of 0.0001 Pa or less and the film forming temperature of 150° C. were applied. A sputtering gas containing 1 vol % of oxygen and 99 vol % of argon (sputtering pressure: 0.3 Pa) was used, and processing time and other conditions were adjusted such that the film thickness of the transparent conductive film became 150 nm.

After formation and before exposure to atmosphere, the conductive film was processed at 150° C. for one hour while introducing a mixed gas of 9 vol % of hydrogen and 91 vol % of argon into the sputtering apparatus.

(3) Evaluation of Transparent Conductive Film

A. Radial Distribution Function (RDF)

Using an X ray with an energy of 20 keV which was obtained from a radiation from SPring-8, which is a radiation facility, an X-ray scattering measurement was performed by grazing incident X-ray scattering method, whereby an X-ray scattering curve was obtained.

The resultant scattering curb was subjected to Fourier conversion to obtain a radial distribution function (RDF).

B. X-Ray Photoelectron Spectroscopy (XPS)

Using an X ray with an energy of 8 keV which was obtained from a radiation from SPring-8, which is a radiation facility, a photoelectron spectroscopy was performed, whereby a spectrum was obtained. As the reference peak, a peak derived from indium $3d_{5/2}$ was set at 445 eV.

C. Specific Resistance, Carrier Concentration, and Mobility of Carrier

Measured using a hole measurement apparatus (RESITEST 8340, manufactured by TOYO Corporation).

D. Contact Resistance

Contact resistance was measured using a Loresta GP resistivity meter (manufactured by Mitsubishi Corporation). The transparent conductive films of which the resistance did not become an overrange (2 MΩ) was assessed as good, the transparent conductive films which became an overrange was assessed as poor.

The results are shown in Table 1.

TABLE 1

| | Example 1 | Example 2 | Example 3 | Example 4 | Com. Ex. 1 | Com. Ex. 2 | Com. Ex. 3 | Com. Ex. 4 |
|---|---|---|---|---|---|---|---|---|
| Target composition | Indium oxide: 89.3 wt % Zinc oxide: 10.7 wt % | Indium oxide: 89.3 wt % Zinc oxide: 10.7 wt % | Indium oxide: 63.0 wt % Zinc oxide: 37.0 wt % | Indium oxide: 97.0 wt % Cerium oxide: 3.0 wt % | Indium oxide: 90.0 wt % Tin Oxide: 10.0 wt % | Indium oxide: 94.0 wt % Zinc oxide: 6.0 wt % | Indium oxide: 100 wt % | Indium oxide: 100 wt % |
| Oxygen amount in target (stoichiometric value) | 0.578(0.586) | 0.578(0.586) | 0.551(0.556) | 0.593(0.596) | 0.609(0.607) | 0.596(0.592) | 0.605(0.600) | 0.605(0.600) |
| Ultimate vacuum (Pa) | 0.0001> | 0.0001> | 0.0001> | 0.0001> | 0.015 | 0.0001> | 0.015 | 0.015 |
| Film forming temp. (→C.) | 150→C. | Room temp. | 150→C. | 150→C. | Room temp. | Room temp. | Room temp. | Room temp. |
| Heat treatment after film formation | None | None | None | None | None | None | None | 250→C. |
| X-ray crystal peak | None | None | None | None | None | None | None | Present |
| RDF peak ratio A/C | 3.0 | 2.9 | 2.7 | 2.9 | 2.4 | 2.8 | 2.1 | — |
| RDF peak ratio A/B | 1.2 | 1.1 | 1.4 | 1.1 | 1.0 | 1.0 | 1.0 | — |
| Peak within a XPS band gap | None | None | None | Present | Present | None | Present | None |
| Specific resistance | 312 | 411 | 597 | 680 | 1187 | 718 | 1390 | 1550 |

TABLE 1-continued

| | Example 1 | Example 2 | Example 3 | Example 4 | Com. Ex. 1 | Com. Ex. 2 | Com. Ex. 3 | Com. Ex. 4 |
|---|---|---|---|---|---|---|---|---|
| (µΩcm) | | | | | | | | |
| Carrier concentration (cm$^{-3}$) | $4.4 \times 10^{20}$ | $3.6 \times 10^{20}$ | $3.5 \times 10^{20}$ | $6.2 \times 10^{20}$ | $4.8 \times 10^{20}$ | $6.4 \times 10^{20}$ | $4.3 \times 10^{20}$ | $0.5 \times 10^{20}$ |
| Mobility (cm$^2$/V · s) | 46.0 | 42.1 | 30.2 | 14.8 | 10.9 | 13.7 | 10.4 | 74.7 |
| Contact resistance | Good | Good | Poor | Poor | Poor | Poor | Poor | Poor |

FIG. 2 shows a radial distribution frequency (RDF) of the transparent conductive film prepared in Example 1.

From the results, it was found that A/C was 3.0 and A/B was 1.2, providing that the maximum value of a peak at an interatomic distance from 0.18 nm to 0.26 nm is C, the maximum value of a peak at an interatomic distance of from 0.30 nm to 0.36 nm is A, and the maximum value of a peak at an interatomic distance of from 0.36 nm to 0.42 nm is B.

Figure 3:
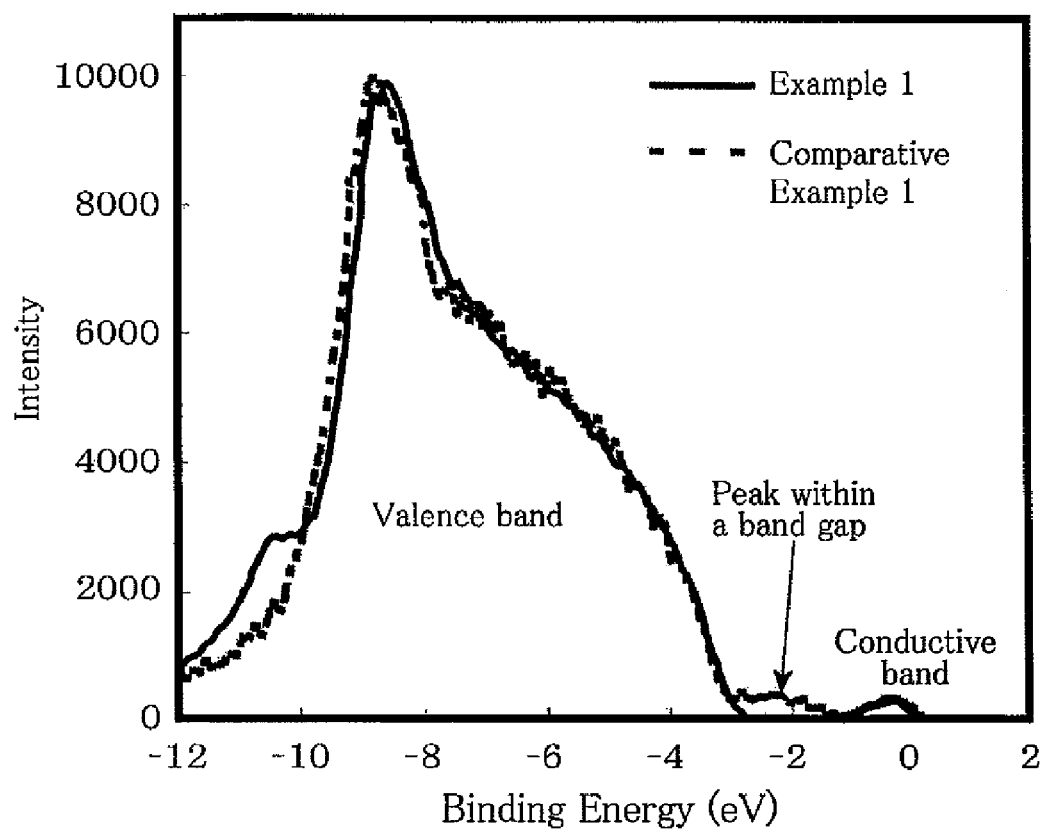
FIG. 3 is a chart of an X-ray photoelectron spectroscopic measurement performed on transparent conductive films prepared in Example 1 and Comparative Example 1.

FIG. 3 shows charts of an X-ray spectroscopic measurements performed on the transparent conductive films prepared in Example 1 and Comparative Example 1 (given later).

From the results, it was confirmed that, in Example 1, no peak components were present between a valence band peak derived from an oxygen 2p orbit and a peak derived from a conductive band electron (i.e. within a band gap). The judgment was based on a fact that the intensity within a band gap is 1% or less of the maximum intensity of the valence band peak.

Example 2

A transparent conductive film was prepared and evaluated in the same manner as in Example 1, except that the film-forming temperature was changed to room temperature (25° C.) and a treatment using a hydrogen-argon mixed gas was not performed after the film formation. The evaluation results are shown in Table 1.

Example 3

A transparent conductive film was prepared and evaluated in the same manner as in Example 1, except that a sputtering target (density: 5.66 g/cc, oxygen amount: 0.551) formed of 63.0 wt % of indium oxide and 37.0 wt % of zinc oxide was used and a treatment using a hydrogen-argon mixed gas was not performed after the film formation. The evaluation results are shown in Table 1.

Example 4

A transparent conductive film was prepared and evaluated in the same manner as in Example 1, except that a sputtering target (density: 6.09 g/cc, oxygen amount: 0.593) formed of 97 wt % of indium oxide and 3 wt % of cerium oxide was used and a treatment using a hydrogen-argon mixed gas was not performed after the film formation. The evaluation results are shown in Table 1.

Comparative Example 1

A transparent conductive film was prepared and evaluated in the same manner as in Example 2, except that a sputtering target (density: 7.0 g/cc, oxygen amount: 0.609) 90 wt % of indium oxide and 10 wt % of tin oxide was used and the ultimate vacuum was changed to 0.015 Pa. The evaluation results are shown in Table 1.

Comparative Example 2

A transparent conductive film was prepared and evaluated in the same manner as in Example 2, using a sputtering target (density: 5.74 g/cc, oxygen amount: 0.596) formed of 94 wt % of indium oxide and 6 wt % of zinc oxide. The evaluation results are shown in Table 1.

Comparative Example 3

A transparent conductive film was prepared and evaluated in the same manner as in Comparative Example 1, except that a sputtering target (density: 6.87 g/cc, oxygen amount: 0.605) formed only of indium oxide was used. The evaluation results are shown in Table 1.

Comparative Example 4

The transparent conductive film prepared in Comparative Example 3 was heated at 250° C. for 30 minutes. The heat-treated transparent conductive film was evaluated in the same manner as in Example 1.

INDUSTRIAL APPLICABILITY

The amorphous transparent conductive film can preferably be used as a transparent electrode for various display devices including LED display devices and EL display devices.

The invention claimed is:

1. An amorphous transparent conductive film containing as a main component a six oxygen-coordinated metal oxide, and satisfying, in a radial distribution function (RDF) obtained by an X-ray scattering measurement, a relationship of A/B>1, providing that the maximum value of RDF at an interatomic distance of from 0.30 nm to 0.36 nm is A and the maximum value of RDF at an interatomic distance of from 0.36 nm to 0.42 nm is B.

2. The amorphous transparent conductive film according to claim 1, which satisfies a relationship of A/C>2.8, providing that the maximum value of RDF at an interatomic distance of from 0.18 nm to 0.26 nm is C.

3. An amorphous transparent conductive film containing as a main component a six oxygen-coordinated metal oxide, which does not contain a peak component between a valence band peak derived from an oxygen 2p orbit and a peak derived from a conductive band electron (within a band gap) of the amorphous transparent conductive film in an X-ray photoelectron spectroscopy (XPS).

4. The amorphous transparent conductive film according to claim 1, wherein the six oxygen-coordinated metal oxide is indium oxide, and the amorphous transparent conductive film further contains zinc oxide.

5. The amorphous transparent conductive film according to claim 4, wherein the amount of the indium oxide in the amorphous transparent conductive film is 70 to 95 mass %.

6. The amorphous transparent conductive film according to claim 1, which further contains an oxide of a positive trivalent or higher metal.

7. A method for producing the amorphous transparent conductive film according to claim 1, comprising sputtering the target containing as a main component a six oxygen-coordinated metal oxide in which the amount of oxygen is not more than a stoichiometric value of the metal oxide at a partial pressure of water inside the sputtering system of $1 \times 10^{-4}$ Pa or less.

8. A method for producing the amorphous transparent conductive film according to claim 7, further comprising bringing the surface of the amorphous transparent conductive film into contact with hydrogen before bringing the amorphous transparent conductive film into contact with atmospheric air.

9. An amorphous transparent conductive film containing as a main component a six oxygen-coordinated metal oxide, and satisfying, in a radial distribution function (RDF) obtained by an X-ray scattering measurement, a relationship of A/B>1, providing that the maximum value of RDF at an interatomic distance of from 0.30 nm to 0.36 nm is A and the maximum value of RDF at an interatomic distance of from 0.36 nm to 0.42 nm is B, produced by a process comprising sputtering the target containing as a main component a six oxygen-coordinated metal oxide in which the amount of oxygen is not more than a stoichiometric value of the metal oxide at a partial pressure of water inside the sputtering system of $1 \times 10^{-4}$ Pa or less.

10. The amorphous, transparent conductive film according to claim 9, wherein the process further comprises bringing the surface of the amorphous transparent conductive film into contact with hydrogen before bringing the amorphous transparent conductive film into contact with atmospheric air.

* * * * *